United States Patent
Liu et al.

(10) Patent No.: US 6,710,288 B2
(45) Date of Patent: Mar. 23, 2004

(54) METHOD AND APPARATUS FOR ALIGNING A WORK PIECE IN A LASER DRILLING SYSTEM

(75) Inventors: Xinbing Liu, Acton, MA (US); Ming Li, Chelmsford, MA (US)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/266,944

(22) Filed: Oct. 8, 2002

(65) Prior Publication Data

US 2004/0016728 A1 Jan. 29, 2004

Related U.S. Application Data

(60) Provisional application No. 60/398,381, filed on Jul. 25, 2002.

(51) Int. Cl.[7] .............................................. B23K 26/03
(52) U.S. Cl. .................................................. 219/121.7
(58) Field of Search ......................... 219/121.7, 121.67, 219/121.68, 121.69, 121.71, 121.72, 121.82, 121.83, 121.78, 121.79, 121.8; 700/166

(56) References Cited

U.S. PATENT DOCUMENTS

| | | | | |
|---|---|---|---|---|
| 5,168,454 A | * | 12/1992 | LaPlante et al. | 700/166 |
| 5,191,187 A | * | 3/1993 | Kajikawa | 219/121.76 |
| 5,751,588 A | * | 5/1998 | Freedenberg et al. | 700/186 |
| 6,520,956 B1 | * | 2/2003 | Huang | 606/5 |

* cited by examiner

Primary Examiner—M. Alexandra Elve
Assistant Examiner—Jonathan Johnson
(74) Attorney, Agent, or Firm—Harness, Dickey & Pierce, PLC

(57) ABSTRACT

A method is provided for aligning a workpiece in a laser drilling system. The method includes: providing a workpiece having at least two substantially planar and parallel surfaces, including a first planar surface in which ablations are formed therein by the laser drilling system; propagating an alignment beam of light towards a second planar surface of the workpiece, the alignment beam being incident on and reflected by the second planar surface, thereby forming a reflected beam of light; measuring a reflection angle of the reflected beam; and determining alignment information for the workpiece based on the measured reflection angle of the reflected beam. The method may further include adjusting alignment of the workpiece based on the alignment information.

18 Claims, 5 Drawing Sheets

METHOD AND APPARATUS FOR ALIGNING A WORK PIECE IN A LASER DRILLING SYSTEM

CROSS-REFERENCE TO RELATED APPLICATIONS

This application claims the benefit of U.S. Provisional Application Ser. No. 60/398,381 which was filed on Jul. 25, 2002 and is incorporated by reference herein.

FIELD OF THE INVENTION

The present invention relates to laser drilling systems, and more particularly, to a method for aligning a workpiece in a laser drilling system.

BACKGROUND OF THE INVENTION

Material ablation by pulsed light sources has been studied since the invention of the laser. Reports in 1982 of polymers having been etched by ultraviolet (UV) excimer laser radiation stimulated widespread investigations of the process for micromachining. Since then, scientific and industrial research in this field has proliferated—mostly spurred by the remarkably small features that can be drilled, milled, and replicated through the use of lasers.

Ultrafast lasers generate intense laser pulses with durations from roughly $10^{-11}$ seconds (10 picoseconds) to $10^{-14}$ seconds (10 femtoseconds). Short pulse lasers generate intense laser pulses with durations from roughly $10^{-10}$ seconds (100 picoseconds) to $10^{-11}$ seconds (10 picoseconds). A wide variety of potential applications for ultrafast and short pulse lasers in medicine, chemistry, and communications are being developed and implemented. These lasers are also a useful tool for milling or drilling holes in a wide range of materials. Hole sizes as small as a few microns, even sub-microns, can readily be drilled. High aspect ratio holes can be drilled in hard materials, such as cooling channels in turbine blades, nozzles in ink-jet printers, or via holes in printed circuit boards.

Optical parallel processing of laser-milled holes is key to increasing the throughput of, and the profitability of laser micromachining. Beam splitting devices such as diffractive optical elements (DOE) are currently used in laser micromachining to divide a single beam into multiple beams to allow for parallel processing of the workpiece (material to be drilled). The multiple sub-beams are focused at a focal plane that is a specific distance from the final lens in a laser drilling system. The focal plane is a plane located at a distance f, which is equal to the focal length of the lens and normal to the optical axis of the beam delivery system.

The target area is comprised of the area of the workpiece where the hole pattern is drilled. The entire target area of the workpiece must be positioned in the focal plane of the sub-beams to ensure consistency of size and shape across all holes being drilled. If the entire target area is not in the focal plane, some of the beams drilling the holes in workpiece will be out of focus when they reach the workpiece, thereby causing the drilled holes not to meet size and shape requirements. What is needed is a way to keep the target area of the workpiece in the focal plane of the laser beam in a laser drilling system.

SUMMARY OF THE INVENTION

In accordance with the present invention, a method is provided for aligning a workpiece in a laser drilling system. The method includes: providing a workpiece having at least two substantially planar and parallel surfaces, including a first planar surface in which ablations are formed therein by the laser drilling system; propagating an alignment beam of light towards a second planar surface of the workpiece, the alignment beam being incident on and reflected by the second planar surface, thereby forming a reflected beam of light; measuring a reflection angle of the reflected beam; and determining alignment information for the workpiece based on the measured reflection angle of the reflected beam. The method may further include adjusting alignment of the workpiece based on the alignment information.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

DETAILED DESCRIPTION OF THE PREFERRED EMBODIMENTS

Figure 1A:
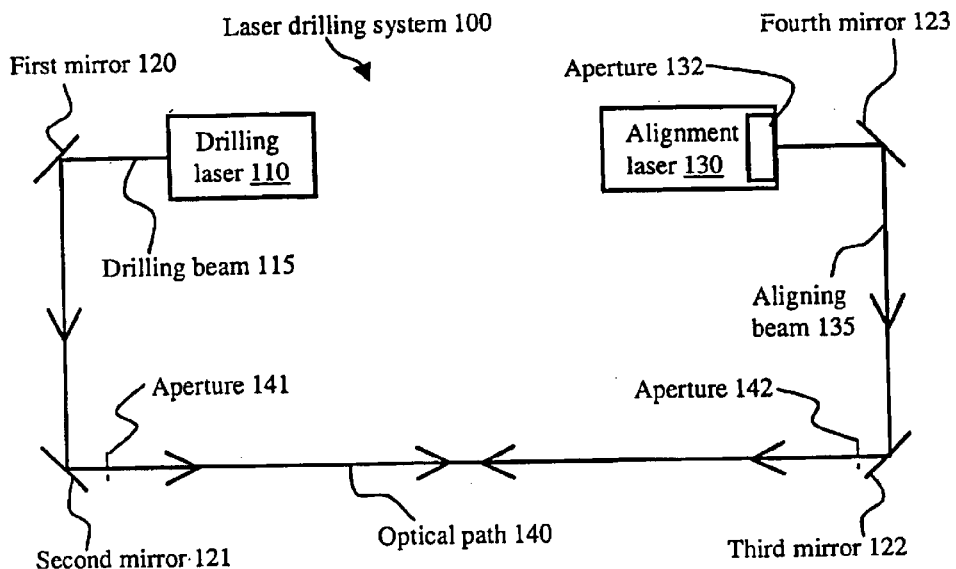
FIG. 1A is a diagram illustrating the optical beam paths, including an alignment beam path, in accordance with the present invention.

FIG. 1A shows the optical beam paths of a laser drilling system 100, including a drilling laser 110, emitting a drilling beam 115; a first mirror 120; a second mirror 121; a third mirror 122; a fourth mirror 123; an alignment laser 130, with an aperture 132 emitting an aligning beam 135; an optical path 140, an aperture 141, and an aperture 142.

Drilling laser 110 is a laser for drilling holes in workpieces. Drilling laser 110 provides sufficient pulse energy to ablate material in a workpiece. Drilling laser 110 emits drilling beam 115.

First mirror 120, second mirror 121, third mirror 122, and fourth mirror 123 are conventional laser mirrors used to reflect drilling beam 115 and aligning beam 135 in laser drilling system 100. In laser drilling system 100, second mirror 121 is a scan mirror that implements a laser milling algorithm (not shown) and guides drilling beam 115 to create the desired shape in the workpiece.

Alignment laser 130 is a counter-propagating, visible laser used to ensure that the workpiece is in the focal plane of drilling laser 110. Alignment laser 130 emits aligning beam 135 from aperture 132. In one example, alignment laser 130 is a HeNe laser with a narrow, well-defined beam, whereas drilling laser 110 is infrared with a larger, less precisely defined beam size.

Optical path 140 is the path of drilling beam 115 through laser drilling system 100. When laser drilling system 100 is properly aligned, drilling beam 115 and aligning beam 135 are co-linear but counter-propagating along optical path 140.

Apertures 141 and 142 are used in the initial alignment of laser drilling system 100. Apertures 141 and 142 are placed between mirrors 121 and 122 as shown in FIG. 1. The centerpoint of apertures 141 and. 142 define optical path 140. When conducting the initial alignment, the first step is turning on drilling laser 110, emitting drilling beam 115, and mirrors 120 and 121 are adjusted to guide drilling beam 115 through apertures 141 and 142. The next step is turning off drilling laser 110, and turning on alignment laser 130, emitting aligning beam 135. Mirrors 123 and 122 are adjusted to guide aligning beam 135 through apertures 142 and 141.

In FIG. 1A, laser drilling system 100 is shown partially assembled. FIG. 1A shows drilling beam 115 and aligning beam 135 in alignment in optical path 140. FIG. 1A represents how mirrors and lasers must be assembled and configured prior to the addition of additional elements and the workpiece to laser drilling system 100. Once laser drilling system 100 is partially assembled and aligned as shown in FIG. 1A, then further assembly can proceed.

Figure 1B:
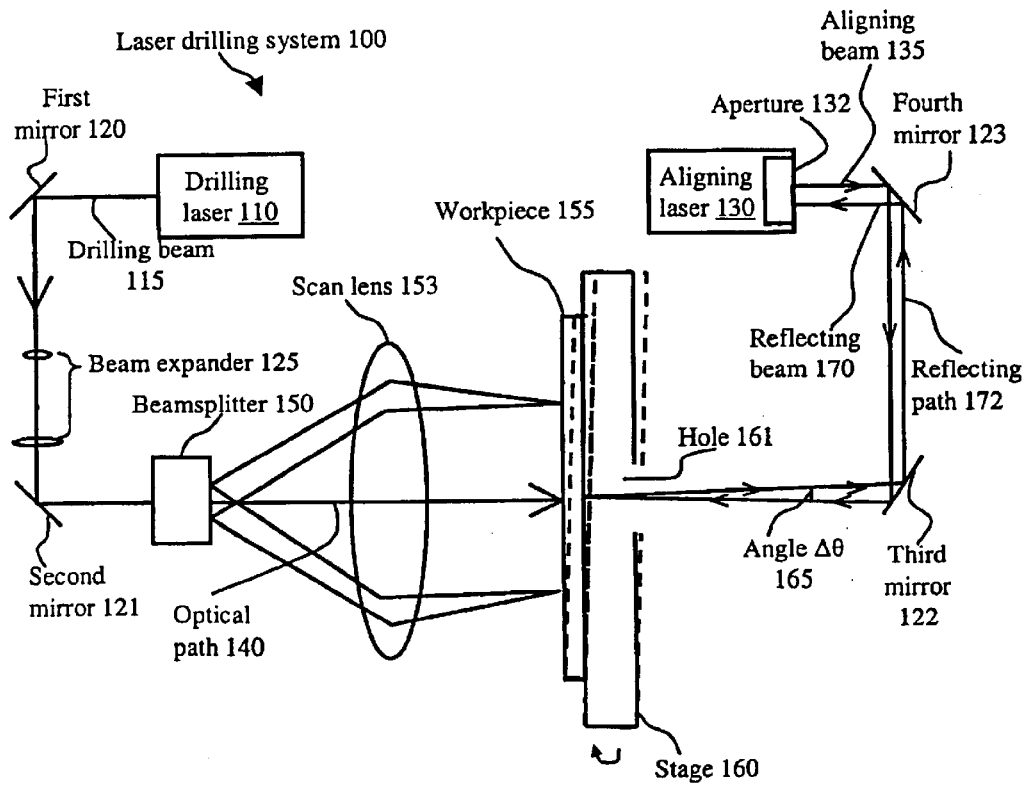
FIG. 1B is a diagram depicting the primary components of an exemplary laser drilling system in accordance with the present invention.

FIG. 1B shows laser drilling system 100 including the elements in FIG. 1A as well as additional elements, including: a beam expander 125, a beamsplitter 150, a scan lens 153, a workpiece 155 on a stage 160 with a hole 161, an angle ($\Delta\theta$) 165, and a reflecting beam 170 traveling along reflecting path 172.

FIG. 1B is not the only configuration of laser drilling system 100 possible. Laser drilling system 100 as shown in FIG. 1B contains only a exemplary set of elements; other elements may be employed by laser drilling system 100. For instance, laser drilling system 100 may include a shutter, an attenuator, a spinning half wave plate, a scan mirror, a microfilter, and/or an image transfer lens.

Beam expander 125 is used in the present invention to match the spot size of drilling beam 115 to the pupil size of scan lens 153.

Beamsplitter 150 is used to split drilling beam 115 into sub-beams to allow for parallel drilling of holes in workpiece 155. In one example, beamsplitter 150 is a diffractive optical element (DOE) splitting drilling beam 115 into 152 sub-beams in the form of a 4×38 beam array.

Scan lens 153 determines the spot size of the sub-beams upon workpiece 155. Telecentricity is required to keep the incident angle between the sub-beams and workpiece 155 perpendicular, which is necessary to drill parallel holes in workpiece 155. In one example, scan lens 153 is a telecentric scan lens with a pupil diameter of 15 mm and a focal length f=100 mm.

Workpiece 155 is the target of laser drilling system 100. The workpiece 155 is generally defined by at least two substantially planar surfaces, such as a thin foil composed of a metal or plastic material. The two planar surface may be oriented parallel to each other. Workpiece 155 is secured on tip/tilt stage 160 with a vacuum (not shown) or other known means.

Stage 160 (also referred to herein as a workpiece holder) is used to position workpiece 155 in optical path 140. Stage 160 is a tip/tilt stage with a hole 161 through stage 160 in the area around optical path 140. Hole 161 is required to allow aligning beam 135 to be incident upon workpiece 155 and reflect back towards third mirror 122. Stage 160 has a tip/tilt mechanism to allow adjustments that ensure workpiece 155 is in the focal plane of the sub-beams of drilling beam 115. In one example, the tip/tilt mechanism inside stage 160 is electronic; alternatively, the tip/tilt mechanism is mechanical or a manual knob. FIG. 1B shows an example of the tip/tilt function of stage 160 with the dashed outline of stage 160 and workpiece 155 showing a slight clockwise rotation of stage 160 and workpiece 155.

Angle ($\Delta\theta$) 165 is the angle between aligning beam 135 and reflecting beam 170 between workpiece 155 and fourth mirror 123.

Reflecting beam 170 is the reflection of aligning beam 135 from workpiece 155. Reflecting path 172 is the optical path of reflecting beam 170.

In operation, drilling laser 110 emits drilling beam 115 along optical path 140. Drilling beam 115 propagates along optical path 140, where it is incident upon first mirror 120. First mirror 120 redirects drilling beam 115 along optical path 140, where it is incident upon beam expander 125. Beam expander matches the width of drilling beam 115 to the pupil size of scan lens 153. Drilling beam 115 exits beam expander 125 and propagates along the optical path where it is incident upon second mirror 121. Second mirror 121 redirects drilling beam 115 along optical path 140, where it is incident upon beamsplitter 150. Beamsplitter 150 splits drilling beam 115 into a plurality of sub-beams, which allow parallel drilling of workpiece 155. The sub-beams exit beamsplitter 150 where they are incident upon scan lens 153. Scan lens 153 focuses the sub-beams upon workpiece 155 for parallel process drilling. Sub-beams ablate workpiece 155 in a pattern according to the pre-defined milling algorithm.

Alignment laser 130 emits aligning beam 135, which counter-propagates along optical path 140 where it is incident upon fourth mirror 123. Fourth mirror 123 redirects aligning beam 135 along optical path 140 where it is incident upon third mirror 122. Third mirror 122 redirects aligning beam 135 along optical path 140 and through the opening in stage 160, at the point where it is incident upon workpiece 155. Workpiece 155 reflects aligning beam 135 back towards third mirror 122 as reflecting beam 170. Reflecting beam 170 propagates along reflecting path 172, where it is incident upon third mirror 122. Third mirror 122 redirects reflecting beam 170 along reflecting path 172, where it is incident upon fourth mirror 123. Fourth mirror 123 redirects reflecting beam 170 along reflecting path 172, where it is incident upon aperture 132. The system operator adjusts stage 160 based on information regarding the size of angle ($\Delta\theta$) 165.

Figure 2:
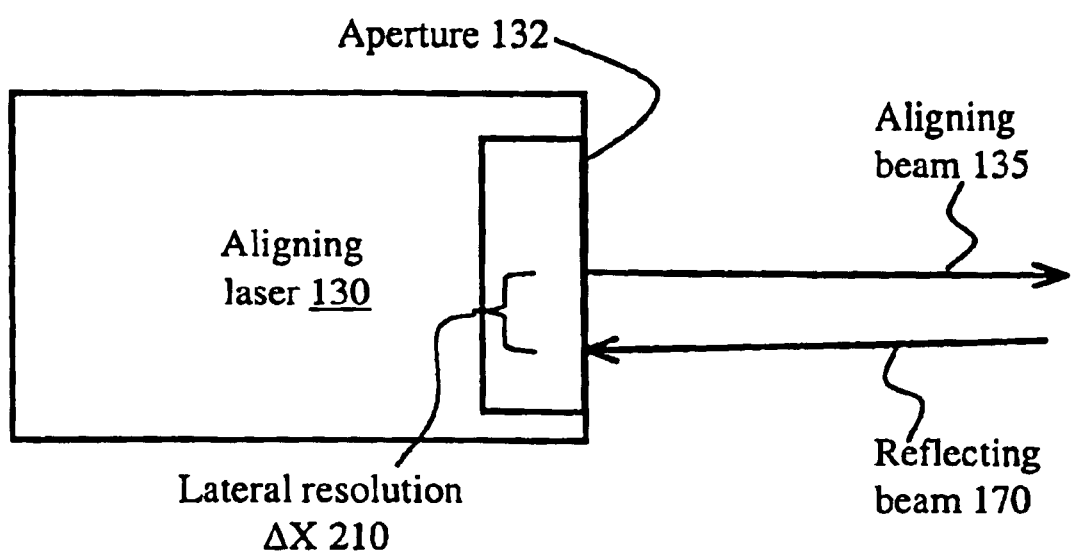
FIG. 2 is a diagram illustrating how lateral resolution is measured between the alignment beam and the reflected beam.

FIG. 2 shows a magnified view of alignment laser 130 and reflecting beam 170 with a lateral resolution $\Delta X$ 210. Lateral resolution $\Delta X$ 210 is the distance between aligning beam 135 and reflecting beam 170 on aperture 132. Lateral resolution $\Delta X$ 210 is a measured distance between the center point of the specular reflection of reflecting beam 170 on aperture 132 and the point where aligning beam 135 is emitted from alignment laser 130. In one example, where reflecting beam 170 is adequately focused to be measured with a photodiode, photodiodes can be placed directly adjacent to aperture 132, positioned as close as possible, to determine lateral resolution $\Delta X$ 210.

Figure 3:
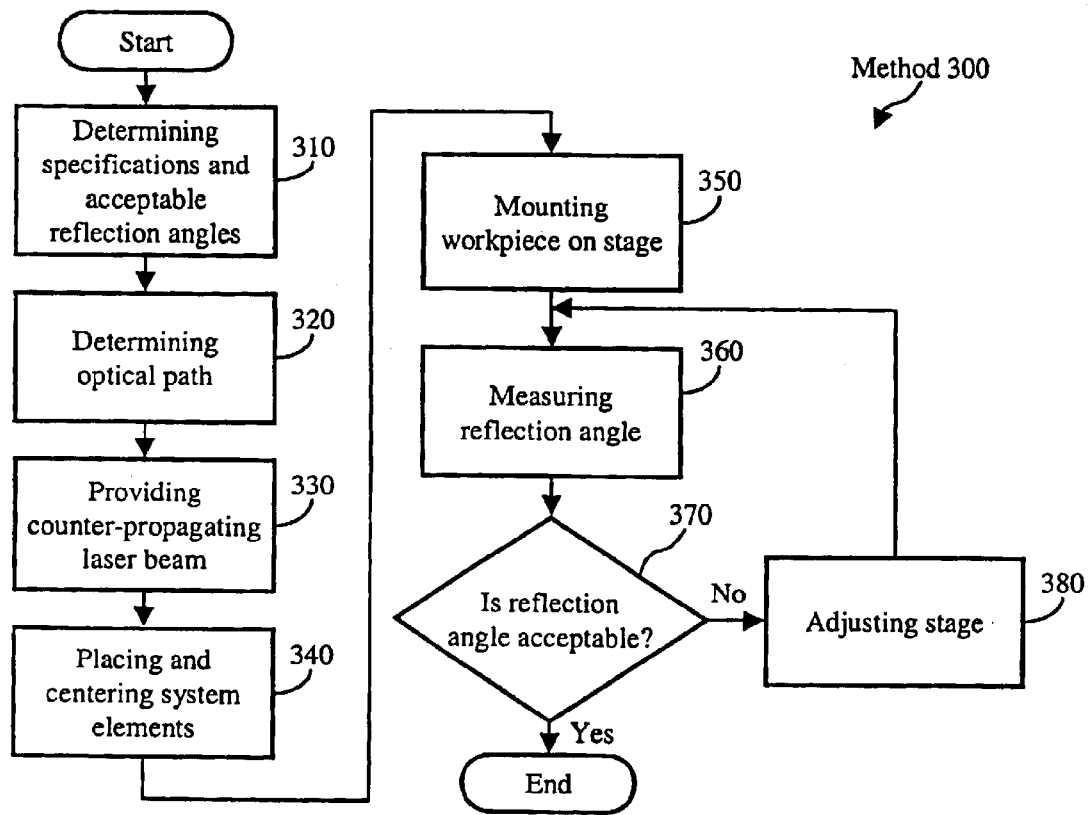
FIG. 3 is a flowchart depicting an exemplary method for aligning a workpiece in a laser drilling system in accordance with the present invention.

FIG. 3 illustrates an exemplary method 300 for aligning a workpiece in a laser drilling system. The method generally includes the steps of: determining specifications and acceptable reflection angles; determining the optical beam path for the drilling laser; providing a counter-propagating alignment beam; aligning optical elements in relation to the optical path of the drilling beam; mounting a workpiece onto a workpiece holder; measuring a reflection angle; and adjusting the workpiece.

First, the specifications for laser drilling system and the acceptable reflection angles are determined in step 310. This step is accomplished by establishing the pattern size or size of target area, L, where the multiple holes are to be drilled in the workpiece 155. The acceptable reflection angles for the defined pattern size are determined using the following equation:

$$\Delta\theta_0 = \frac{\Delta Z_0}{L}, \quad (1)$$

wherein $\Delta\theta_0$ is the acceptable tilt angle of the workpiece that can yield a drilled workpiece that is within specification; $\Delta Z_0$ is the acceptable depth of focus that yields a drilled workpiece to meet product specifications (change in axial distance Z); and L is the pattern size (roughly the radius of pattern to be drilled).

In equation (1), $\Delta Z_0$ is experimentally determined, and L is known, so $\Delta\theta_0$ can be determined. Equation (1) states that the acceptable angle $\Delta\theta_0$ is equal to the axial distance reflecting beam 170 travels between workpiece 155 and aperture 132, divided by the pattern size.

In step 320, the laser drilling system 100 is assembled as shown in FIG. 1A, such that the optical path 140 is defined by the path of drilling beam 115.

Next, the counter-propagating alignment beam is established at step 330. In this step, alignment laser 130 emits aligning beam 135, which is a counter-propagating, visible laser beam. Alignment laser 130, first mirror 120, second mirror 121, third mirror 122, and fourth mirror 123 are adjusted such that drilling beam 110 and aligning beam 135 propagate through apertures 141 and 142, thereby forming optical path 140. In step 340, the remaining optical elements of laser drilling system 100 are placed and centered in optical path 140. It is readily understood that the alignment beam 135 may used to align certain optical elements, such as the scan lens 153.

The workpiece 155 is the secured on stage 160 at step 350. In general, the workpiece 155 and stage 160 are positioned to be perpendicular to optical path 140. The remaining steps provide a way to precisely measure the axial position of workpiece 155 to ensure that the target area of workpiece 155 is perpendicular to optical path 140.

In step 360, an aligning beam 135 is reflected off the back side of workpiece 155 (and at that point becoming reflecting beam 170), is deflected by third mirror 122 and fourth mirror 123, and is incident upon aperture 132. As described in FIG. 2, the distance between the point where reflecting beam 170 is incident upon aperture 132 and the point where aligning beam 135 is emitted is called lateral resolution $\Delta X$ 210. Using this measurement of lateral resolution $\Delta X$ 210 with the measurement of Z, reflection angle $\Delta\theta$ 165 can be calculated using the following equation:

$$\Delta\theta = \frac{\Delta X}{Z}, \quad (2)$$

where, $\Delta\theta$ is the measured reflection angle 165 between aligning beam 135 and reflecting beam 170; $\Delta X$ is the distance between aligning beam 135 and reflecting beam 170 on aperture 132; and Z is the axial distance reflecting beam 170 travels between workpiece 155 and aperture 132.

In equation (2), lateral resolution 210 is equal to $\Delta X$, and Z is the axial distance from workpiece 155 to aperture 132. Since $\Delta X$ and Z are measured, $\Delta\theta$ can be determined. In an exemplary application of drilling inkjet nozzles, lateral resolution 210 is 1 mm and Z=1.0 m, which yields angle $\Delta\theta$=1/1000 or 0.001.

The method 300 then determines if the reflection angle is within an acceptable range at step 370. Acceptable reflection angle $\Delta\theta_0$ is compared to actual reflection angle $\Delta\theta$ 165 is accordance with the following equation:

$$\Delta\theta \leq \Delta\theta_0 = \frac{\Delta Z_0}{L}, \quad (3)$$

According to equation (3), if measured reflection angle $\Delta\theta$ 165 is less than or equal to acceptable reflection angle $\Delta\theta_0$, method 300 ends. If measured reflection angle $\Delta\theta$ 165 is more than acceptable reflection angle $\Delta\theta_0$, method 300 proceeds to step 380. In the example of drilling inkjet nozzles, the acceptable depth of focus, $\Delta Z_0$, is 20 microns and the target area on workpiece 155 L, is 15000 microns. This yields an acceptable reflection angle $\Delta\theta_0$ of $$\frac{20}{15000} = 0.007.$$

Lastly, alignment data regarding the position of reflecting beam 170 may be used to adjust stage 160 at step 380. In the preferred example, a system operator adjusts stage 160 using mechanical means. In another example, a photodiode array sends data regarding the position of reflecting beam 170 to stage control (not shown) and stage 160 is adjusted with the tip/tilt mechanism to decrease reflection angle $\Delta\theta$ 165. The method 300 then returns to step 360.

Figure 4:
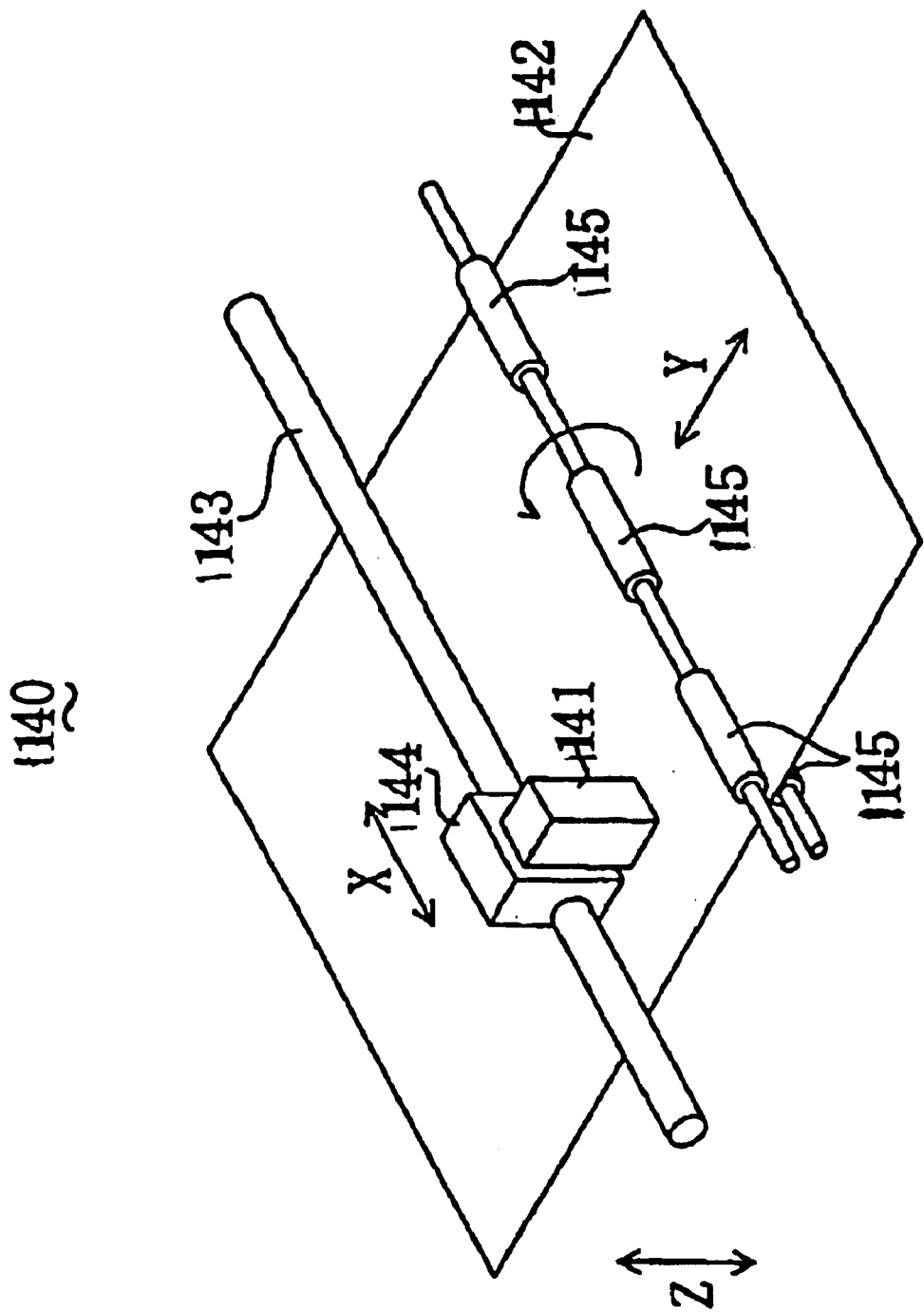
FIG. 4 is a perspective view illustrating the primary components of an ink-jet printer.

A laser drilling system in accordance with the present invention may be used to construct a nozzle plate of an ink-jet head as further described below. Referring to FIG. 4, an ink-jet printer 1140 includes an ink-jet head 1141 capable of recording on a recording medium 1142 via a pressure generator. The ink-jet head 1141 is mounted on a carriage 1144 capable of reciprocating movement along a carriage shaft 1143.

In operation, ink droplets emitted from the ink-jet head 1141 are deposited on the recording medium 1142, such as a sheet of copy paper. The ink-jet head 1141 is structured such that it can reciprocate in a primary scanning direction X in parallel with the carriage shaft 1143; whereas the recording medium 1142 is timely conveyed by rollers 1145 in a secondary scanning direction Y.

Figure 5:
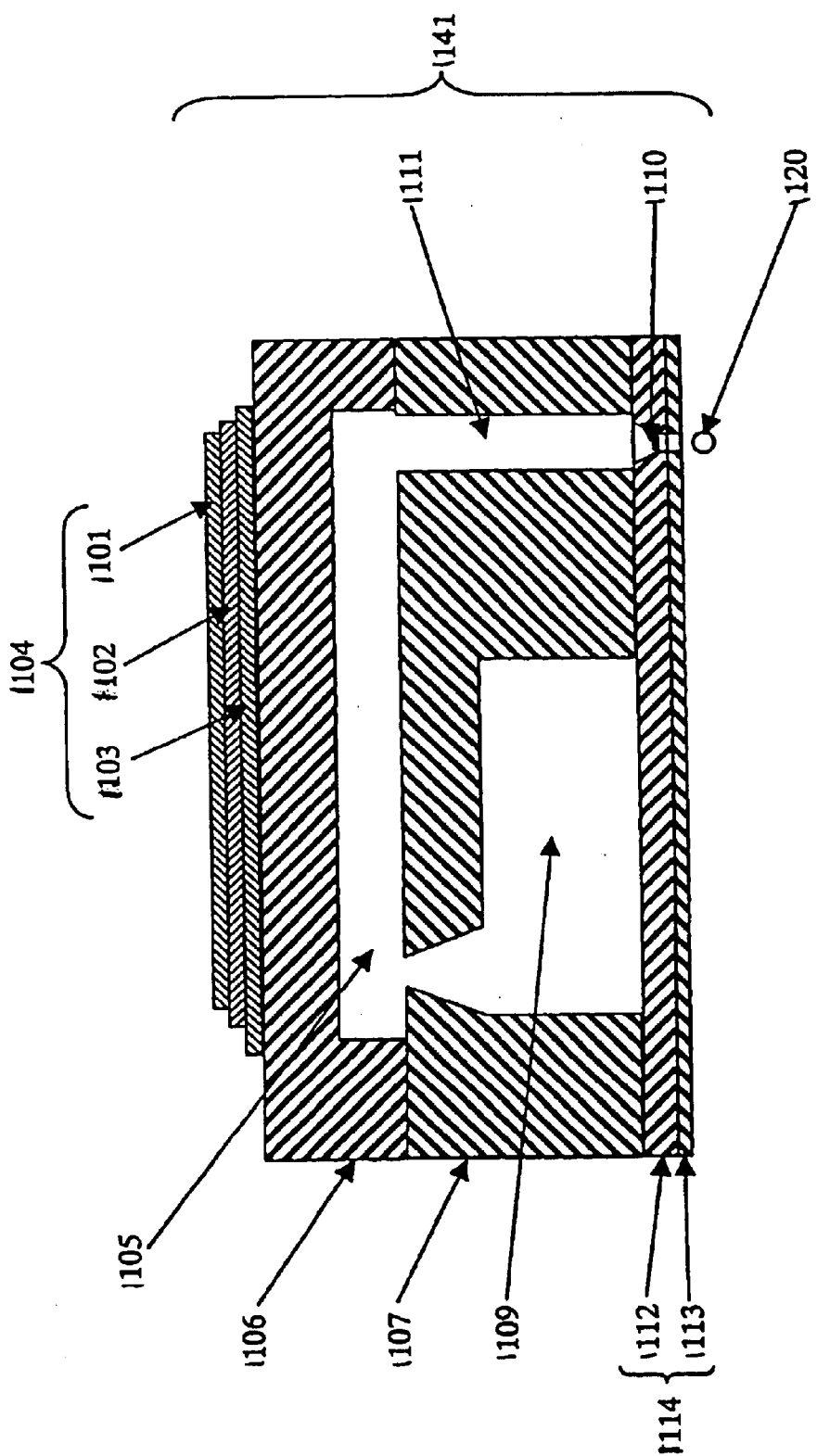
FIG. 5 is a cross-sectional schematic view of an exemplary ink-jet head.

FIG. 5 further illustrates the construction of an exemplary ink-jet head 1141. The ink-jet head is primarily comprised of a pressure generator 1104 and a nozzle plate 1114. In this embodiment, the pressure generator 1104 is a piezoelectric system having an upper electrode 1101, a piezoelectric element 1102, and a lower electrode 1103. Although a piezoelectric system is presently preferred, it is envisioned that other types of systems (e.g., a thermal-based system) may also be employed by the ink-jet head 1141.

The nozzle plate 1114 is further comprised of a nozzle substrate 1112 and a water repellent layer 1113. The nozzle substrate 1112 may be constructed from a metal or resin material; whereas the water repellant layer 1113 is made of fluororesin or silicone resin material. In this exemplary embodiment, the nozzle substrate 1112 is made of stainless steel having a thickness of 50 um and the water repellent layer 1113 is made of a fluororesin having a thickness of 0.1 um.

The ink-jet head 1141 further includes an ink supplying passage 1109, a pressure chamber 1105, and an ink passage 1111 disposed between the pressure generator 1104 and the nozzle plate 1114. In operation, ink droplets 1120 are ejected from the nozzle 110. The nozzle 1110 is preferably formed without flash and foreign matter (e.g., carbon, etc.) in the nozzle plate. In addition, the accuracy of the nozzle outlet diameter is 20 um±1.5 um.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A method for aligning a workpiece in a laser drilling system, comprising:

providing a workpiece having at least two substantially planar surfaces, including a first planar surface in which ablations are formed therein by the laser drilling system;

propagating an alignment beam of light towards a second planar surface of the workpiece, the alignment beam being incident on and reflected by the second planar surface, thereby forming a reflected beam of light;

measuring a reflection angle of the reflected beam; and determining alignment information for the workpiece based on the measured reflection angle of the reflected beam.

2. The method of claim 1 further comprising adjusting alignment of the workpiece based on the alignment information.

3. The method of claim 1 further comprises subsequently propagating one or more drilling beams of light towards the first planar surface of the workpiece, thereby forming ablations therein.

4. The method of claim 1 wherein the step of propagating an alignment beam further comprises the second planar surface being oriented in parallel with the first planar surface.

5. The method of claim 1 further comprises adjusting alignment of the workpiece when the measured reflection angle exceeds a predetermined threshold.

6. The method of claim 2 wherein the step of adjusting alignment of the workpiece further comprises aligning the first planar surface of the workpiece with a focal plane of the drilling beams incident thereon.

7. The method of claim 2 wherein the step of adjusting the alignment of the workpiece further comprises aligning the first planar surface of the workpiece such that a drilling beam is incident upon and perpendicular to the first planar surface.

8. The method of claim 1 wherein the step of measuring a reflection angle further comprises directing the reflected beam towards a light source for the alignment beam and determining a distance between the light source for the alignment beam and a location at which the reflection beam is incident on the light source.

9. A method for aligning a workpiece in a laser drilling system, comprising:

providing a workpiece holder having a front side, a back side, and a through hole passing from the front side to the back side;

mounting a workpiece onto the front side of the workpiece holder, the workpiece having a front planar surface and a back planar surface and orientated such that a portion of the back planar surface aligns with the through hole formed in the front side of the workpiece holder;

propagating an alignment beam of light towards the back side of the workpiece holder, the alignment beam passing through the through hole and being reflected by the portion of the back planar surface which aligns with the through hole, thereby forming a reflected beam of light;

measuring a reflection angle of the reflected beam; and determining alignment information for the workpiece based on the measured reflection angle of the reflected beam.

10. The method of claim 9 further comprising adjusting alignment of the workpiece based on the alignment information.

11. The method of claim 9 further comprises subsequently propagating one or more drilling beams of light towards the first planar surface of the workpiece, thereby forming ablations therein.

12. The method of claim 10 further comprises adjusting alignment of the workpiece when the measured reflection angle exceeds a predetermined threshold.

13. The method of claim 10 wherein the step of adjusting alignment of the workpiece further comprises aligning the first planar surface of the workpiece with a focal plane of the drilling beams incident thereon.

14. The method of claim 10 wherein the step of adjusting the alignment of the workpiece further comprises aligning the first planar surface of the workpiece such that a drilling beam is incident upon and perpendicular to the first planar surface.

15. The method of claim 9 wherein the step of measuring a reflection angle further comprises directing the reflected beam towards a light source for the alignment beam and determining a distance between the light source for the alignment beam and a location at which the reflection beam is incident on the light source.

16. The method of claim 15 wherein the step of measuring a reflection angle is based on the distance between the light source for the alignment beam and a location at which the reflection beam is incident on the light source, and an axial distance traveled by the reflection beam from the workpiece to the light source.

17. The method of claim 1 wherein the workpiece is further defined as a nozzle plate of an ink-jet head.

18. The method of claim 9 wherein the workpiece is further defined as a nozzle plate of an ink-jet head.

* * * * *